US011822233B2

(12) United States Patent
Miyai et al.

(10) Patent No.: US 11,822,233 B2
(45) Date of Patent: Nov. 21, 2023

(54) IMAGE PICKUP APPARATUS AND FOCUS ADJUSTMENT METHOD USING BENDING CORRECTION TO ADJUST FOCUSING

(71) Applicant: Lasertec Corporation, Kanagawa (JP)

(72) Inventors: Hiroki Miyai, Yokohama (JP); Yoshito Fujiwara, Yokohama (JP); Yoshihiro Kato, Yokohama (JP)

(73) Assignee: Lasertec Corporation, Yokohama (JP)

( * ) Notice: Subject to any disclaimer, the term of this patent is extended or adjusted under 35 U.S.C. 154(b) by 797 days.

(21) Appl. No.: 16/931,208

(22) Filed: Jul. 16, 2020

(65) Prior Publication Data

US 2021/0018832 A1    Jan. 21, 2021

(30) Foreign Application Priority Data

Jul. 19, 2019  (JP) ................................ 2019-133401

(51) Int. Cl.
*G03F 1/84* (2012.01)
*G03F 1/24* (2012.01)
*G03F 1/76* (2012.01)
*G03F 1/66* (2012.01)
*G03F 1/44* (2012.01)
*G03B 13/36* (2021.01)

(52) U.S. Cl.
CPC .............. *G03F 1/84* (2013.01); *G03B 13/36* (2013.01); *G03F 1/24* (2013.01); *G03F 1/44* (2013.01); *G03F 1/66* (2013.01); *G03F 1/76* (2013.01)

(58) Field of Classification Search
CPC ..... G03F 1/84; G03F 1/24; G03F 1/44; G03F 1/66; G03F 1/76; G03B 13/36
See application file for complete search history.

(56) References Cited

U.S. PATENT DOCUMENTS

| 5,241,188 A | * | 8/1993 | Mizutani ............... G03F 9/7026 250/548 |
| 2007/0024831 A1 | * | 2/2007 | Hibbs .................... G03F 7/707 355/75 |
| 2011/0225554 A1 | * | 9/2011 | Laske .................. G03F 9/7034 716/52 |

(Continued)

FOREIGN PATENT DOCUMENTS

| CN | 106154759 A | * | 11/2016 | ............... G03F 1/84 |
| JP | 2015064477 A | | 4/2015 | |
| JP | 2016151733 A | | 8/2016 | |

*Primary Examiner* — Michael P LaPage
(74) *Attorney, Agent, or Firm* — McCoy Russell LLP

(57) ABSTRACT

An image pickup apparatus includes a stage configured to support a sample at a plurality of support points, a bending data acquisition unit configured to acquire bending data corresponding to a bending of the sample supported on the stage, a height information detection unit configured to detect a height of the sample supported on the stage, a difference value calculation unit configured to calculate a difference value between a height indicated by height information and a height indicated by the bending data at each of a plurality of points on the sample, a correction data calculation unit configured to calculate correction data based on the difference value, and an estimation unit configured to calculate estimation data for estimating the height of the sample by correcting the bending data using the correction data.

8 Claims, 7 Drawing Sheets

(56) References Cited

U.S. PATENT DOCUMENTS

2014/0240700 A1* 8/2014 Ogawa ................ G01N 21/956
                                                    356/244
2017/0363969 A1* 12/2017 Hauptmann ........ G03F 7/70508
2021/0364908 A1* 11/2021 Blaesing-Bangert ......................
                                                    G02B 27/32

* cited by examiner

IMAGE PICKUP APPARATUS AND FOCUS ADJUSTMENT METHOD USING BENDING CORRECTION TO ADJUST FOCUSING

CROSS-REFERENCE TO RELATED APPLICATION

The present application claims priority to Japanese Patent Application No. 2019-133401 filed on Jul. 19, 2019. The entire contents of the above-listed application is hereby incorporated by reference for all purposes.

TECHNICAL FIELD

The present disclosure relates to an image pickup apparatus and a focus adjustment method.

BACKGROUND

Japanese Unexamined Patent Application Publication No. 2015-64477 (hereinafter referred to as Patent Literature 1) discloses an apparatus and a method for measuring a position of a pattern corresponding to changes in a membrane stress in a multilayer film. In the apparatus disclosed in Patent Literature 1, a substrate is supported by using a holding device having three support points. This apparatus includes two sets of holding devices in which three triangles formed by their support points have different sizes. The apparatus measures a pattern in a state where the substrate is supported by each of the holding devices, and thereby calculates a membrane stress. The apparatus corrects the measurement position by reflecting the membrane stress in the bending of the substrate caused by its own weight.

Japanese Unexamined Patent Application Publication No. 2016-151733 (hereinafter referred to as Patent Literature 2) discloses an inspection apparatus and an inspection method for a photomask. In Patent Literature 2, design data of a transfer pattern is corrected based on data on the amount of deviation of coordinates. A deviation of coordinates is corrected by obtaining data indicating a deformation component of the main plane caused by the own weight.

SUMMARY

It should be noted that in a photomask inspection apparatus or the like, a sample is photographed in a state where the focus is adjusted onto a pattern-formed surface (i.e., the main surface) of the substrate on which a pattern is formed. When a stage that supports the sample at a plurality of points such as at three points is used, the sample is bent. Further, the amount of the bending (hereinafter also referred to as the bending amount) of the sample changes according to the place (coordinates) on the sample. Further, when a pattern is formed on the substrate, the bending amount changes due to the membrane stress. Depending on the method for detecting a height in an autofocusing mechanism, an error may occur in the measurement of the focus position. Therefore, in some cases, the focus cannot be speedily adjusted. For example, even when the inspection apparatus is equipped with an autofocusing mechanism, the focus position may be widely deviated and it may take time to move it to the in-focus position.

The present disclosure has been made in view of the above-described circumstances, and provides an image pickup apparatus and a focus adjustment method capable of appropriately and speedily adjust a focus.

A first exemplary aspect is an image pickup apparatus including: a stage configured to support a sample at a plurality of support points; a bending data acquisition unit configured to acquire bending data corresponding to a bending of the sample supported on the stage; a height information detection unit configured to detect height information of the sample supported on the stage; a difference value calculation unit configured to calculate a difference value between a height indicated by the height information and a height indicated by the bending data at each of a plurality of points on the sample; a correction data calculation unit configured to calculate correction data based on the difference value; an estimation unit configured to calculate estimation data for estimating the height of the sample by correcting the bending data using the correction data; and a control unit configured to adjust a focus by using the estimation data.

In the above-described image pickup apparatus, the correction data calculation unit may calculate the correction data by using a biharmonic equation.

The above-described image pickup apparatus may further include: an illumination light source configured to generate illumination light; an optical element configured to concentrate light coming from the sample illuminated by the illumination light; and a detector configured to detect light coming from the optical element, in which the control unit may perform autofocusing by changing a distance between the optical element and the sample while using a height in the estimation data as a reference height.

In the above-described image pickup apparatus, the bending data may be obtained by a numerical analysis.

Another exemplary aspect is a focus adjustment method for adjusting a focus onto a sample supported on a stage having a plurality of support points, including: acquiring bending data corresponding to a bending of the sample supported on the stage; detecting height information of the sample supported on the stage; calculating a difference value between a height indicated by the height information and a height indicated by the bending data at each of a plurality of points on the sample; calculating correction data based on the difference value; calculating estimation data for estimating the height of the sample by correcting the bending data using the correction data; and adjusting a focus by using the estimation data.

In the above-described focus adjustment method, the correction data may be calculated by using a biharmonic equation.

In the above-described focus adjustment method, a detector may detect light coming from the sample illuminated by illumination light through an optical element, and autofocusing may be performed by changing a distance between the optical element and the sample while using a height in the estimation data as a reference height.

In the above-described focus adjustment method, the bending data may be obtained by a numerical analysis.

According to the present disclosure, it is possible to provide an image pickup apparatus and a focus adjustment method capable of speedily adjusting a focus.

The above and other objects, features and advantages of the present disclosure will become more fully understood from the detailed description given hereinbelow and the accompanying drawings which are given by way of illustration only, and thus are not to be considered as limiting the present disclosure.

DETAILED DESCRIPTION

Embodiments according to the present disclosure are explained hereinafter with reference to the drawings. The following descriptions are given for showing preferred embodiments according to the present disclosure, and the scope of the present disclosure should not be limited to the below-shown embodiments. In the following descriptions, components/structures to which the same symbols are assigned are substantially equivalent to each other.

An optical apparatus according to this embodiment is, for example, an image pickup apparatus that takes an image of a sample (i.e., photographs a sample). In the following descriptions, it is assumed that the optical apparatus is an inspection apparatus that performs an inspection based on an image that is obtained by having an image pickup apparatus photograph a sample (hereinafter also referred to as a sample image). The inspection apparatus inspects a sample such as a photomask or a semiconductor wafer on which a microscopic pattern is formed. The inspection apparatus performs an inspection by using information of a sample image. For example, the inspection apparatus detects a defect by comparing the intensity of a signal of the sample image with a threshold or comparing the sample image with other images. In the following descriptions, it is assumed that the sample is a photomask that is used in a photolithography process for a semiconductor device.

Figure 1:
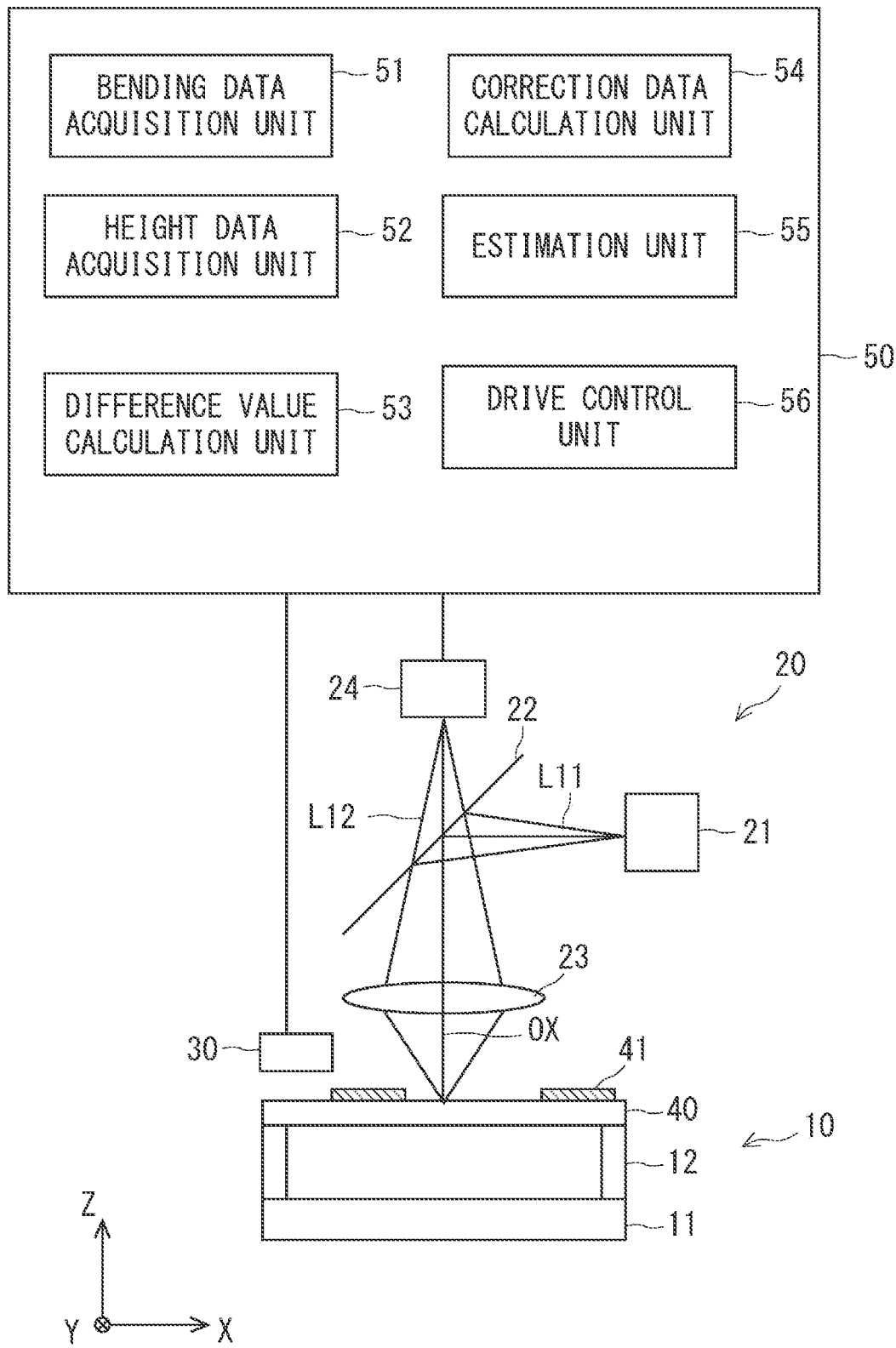
FIG. 1 is a schematic diagram showing an overall configuration of an image pickup apparatus according to an embodiment.

An image pickup apparatus and a focus adjustment method according to this embodiment will be described with reference to FIG. 1. FIG. 1 schematically shows an overall configuration of an image pickup apparatus. The image pickup apparatus 100 includes a stage 10, an image pickup optical system 20, a height information detection unit 30, and a processing device 50.

In FIG. 1, a 3D (three-dimensional) XYZ-orthogonal coordinate system is shown for clarifying the explanation. Note that the Z-direction is the vertical direction and is parallel to the thickness direction of the sample 40. Therefore, the Z-direction is the height direction. A pattern 41 such as one for a light blocking film is formed on the upper surface of the sample 40. The Z-direction is the direction of the normal to the pattern-formed surface (the main surface) of the sample 40. The X- and Y-directions are horizontal directions and are parallel to the direction of the pattern formed on the sample 40. The Z-direction is the thickness direction of the sample 40. The sample 40 is a photomask as described above, and hence is a rectangular substrate. Further, the X- and Y-directions are parallel to the edges of the sample 40.

The sample 40 to be photographed is placed on the stage 10. As described above, the sample 40 is a photomask. The stage 10 is a 3D drive stage, and is driven in the XYZ-directions by the drive control unit 56 of the processing device 50. Note that the control of the stage 10 by the drive control unit 56 is not limited to the control in the XYZ-directions. For example, the control of the stage 10 may include the control of the posture thereof such as the direction of the rotation thereof.

The stage 10 includes a pedestal 11 and support pins 12. A plurality of support pins 12 are provided on the upper surface of the pedestal 11. That is, the support pins 12 protrude from the pedestal 11 in the Z-axis positive direction. Further, the sample 40 is placed on the support pins 12. The upper surfaces of the support pins 12 are in contact with the lower surface of the sample 40. The support pins 12 serve as support points for the sample 40. The heights of the plurality of support pins 12 are equal to each other.

Figure 2:
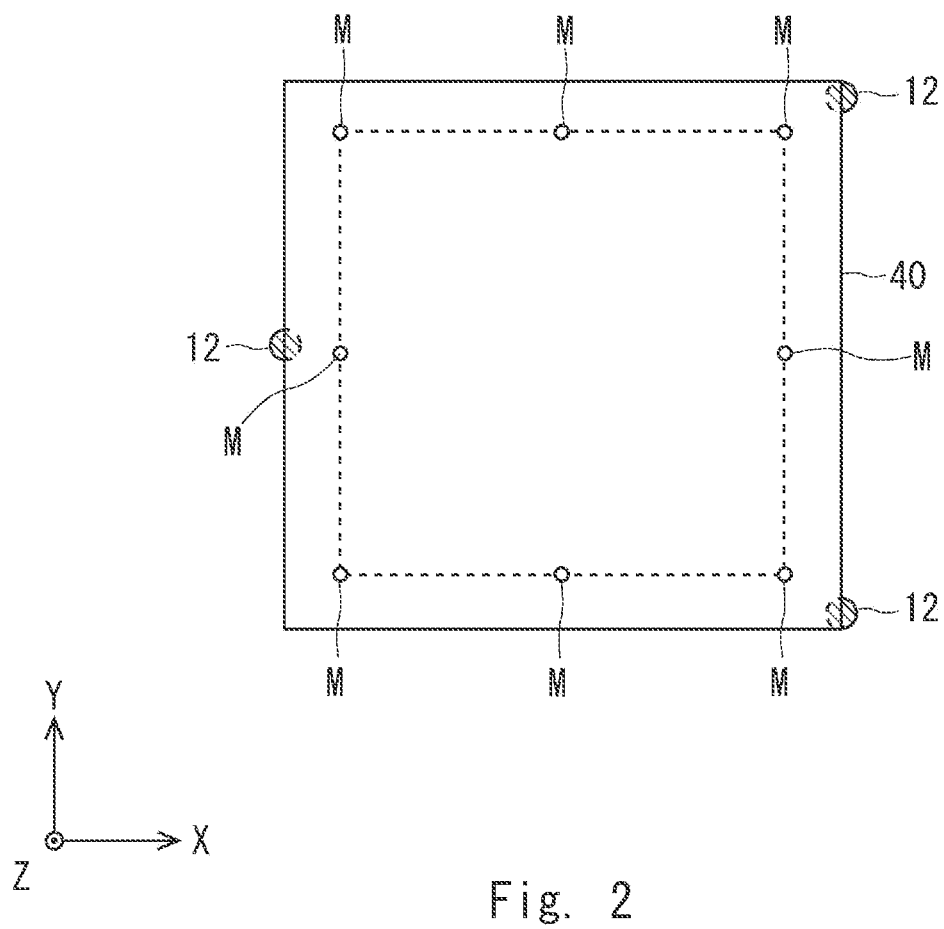
FIG. 2 shows a configuration of a height information detection unit.

FIG. 2 is a top view showing an example of an arrangement of the support pins 12. As shown in FIG. 2, three support pins 12 support the sample 40. The sample 40 is supported at the three points on the stage 10. Specifically, the support pins 12 are disposed at the upper right corner, at the lower right corner, and at the center of the left edge of the rectangular sample 40. Needless to say, the arrangement of the support pins 12 is not limited to the one shown in FIG. 2. Further, the number of support pins is not limited to three. The sample 40 may be supported by support members other than the support pins 12. Note that measurement points M shown in FIG. 2 will be described later.

Referring to FIG. 1 again, the image pickup optical system 20 will be described. The image pickup optical system 20 includes a light source 21, a beam splitter 22, an objective lens 23, and an image pickup element 24. Note that the drawing of the image pickup optical system 20 shown in FIG. 1 is simplified as appropriate. The image pickup optical system 20 may include optical elements other than the above-described components, such as a lens, an optical scanner, a mirror, a filter, a beam splitter, and the like. Note that the beam splitter is not indispensable. For example, the image pickup optical system 20 may be a confocal optical system.

The light source 21 generates illumination light L11. The light source 21 may be a lamp light source, an LED (Light Emitting Diode) light source, a laser light source, or the like. The illumination light L11 emitted from the light source 21 is incident on the beam splitter 22. The beam splitter 22 is, for example, a half mirror, and reflects substantially half of the illumination light L11 in the direction toward the sample 40. The illumination light L11 reflected by the beam splitter 22 enters the objective lens 23. The objective lens 23 concentrates the illumination light L11 onto the sample 40. In this way, the surface (the pattern-formed surface) of the sample 40 can be illuminated. An optical axis OX of the objective lens 23 is parallel to the Z-direction. Alternatively, the illumination light L11 is concentrated by using, instead of using the objective lens 23, other optical elements such as an objective reflecting mirror.

Reflected light L12 reflected on the surface of the sample 40 is concentrated by the objective lens 23 and is incident on the beam splitter 22. The beam splitter 22 lets substantially half of the reflected light L12 pass therethrough. The reflected light L12 that has passed through the beam splitter 22 enters the image pickup element 24. In this way, it is possible to take an image of the sample 40. Further, a lens for forming an image of the reflected light L12 on a light receiving surface of the image pickup element 24 may be provided.

The image pickup element 24 is a 2D (two-dimensional) array sensor such as a CCD (Charge Coupled Device) camera or a CMOS (Complementary Metal Oxide Semiconductor) sensor. Alternatively, the image pickup element 24 may be a photodetector such as a line sensor, a photodiode, a photomultiplier tube, or the like. The image pickup element 24 outputs detection data corresponding to the amount of received light to the processing device 50. The processing device 50 inspects the sample 40 based on reflection luminance values indicated by the detection data. Since a known technique can be used for the inspection process, the description thereof will be omitted.

The stage 10 is a drive stage, and can move the sample 40 in the XY-directions. The drive control unit 56 of the processing device 50 controls the driving of the stage 10. The drive control unit 56 can change the illuminated place on the sample 40 by moving the stage 10 in the XY-directions. Therefore, it is possible to photograph an arbitrary place on the sample 40 and thereby to inspect the entire surface of the sample 40. Needless to say, the drive control unit 56 may drive the image pickup optical system 20 instead of driving the stage 10. That is, all that is required is that the relative position of the image pickup optical system 20 with respect to the stage 10 should be able to be moved. Alternatively, the illumination light L11 may be scanned (i.e., continuously or successively moved) by using an optical scanner or the like.

Further, the stage 10 can move the sample 40 in the Z-direction. In this way, it is possible to adjust the focus position onto the pattern-formed surface of the sample 40. That is, when the drive control unit 56 moves the stage 10 in the Z-direction, the distance between the objective lens 23 and the sample 40 in the Z-direction changes. In this way, it is possible to adjust the focus. The image pickup optical system 20 can photograph the sample 40 in a state where the focus (the focal point) is adjusted onto the pattern-formed surface of the sample 40. The sample 40 can be properly inspected. Needless to say, the focus may be adjusted by moving the image pickup optical system 20, instead of moving the stage 10, in the Z-direction. The drive control unit 56 adjusts the focus by driving the stage 10 or the objective lens 23.

Figure 3:
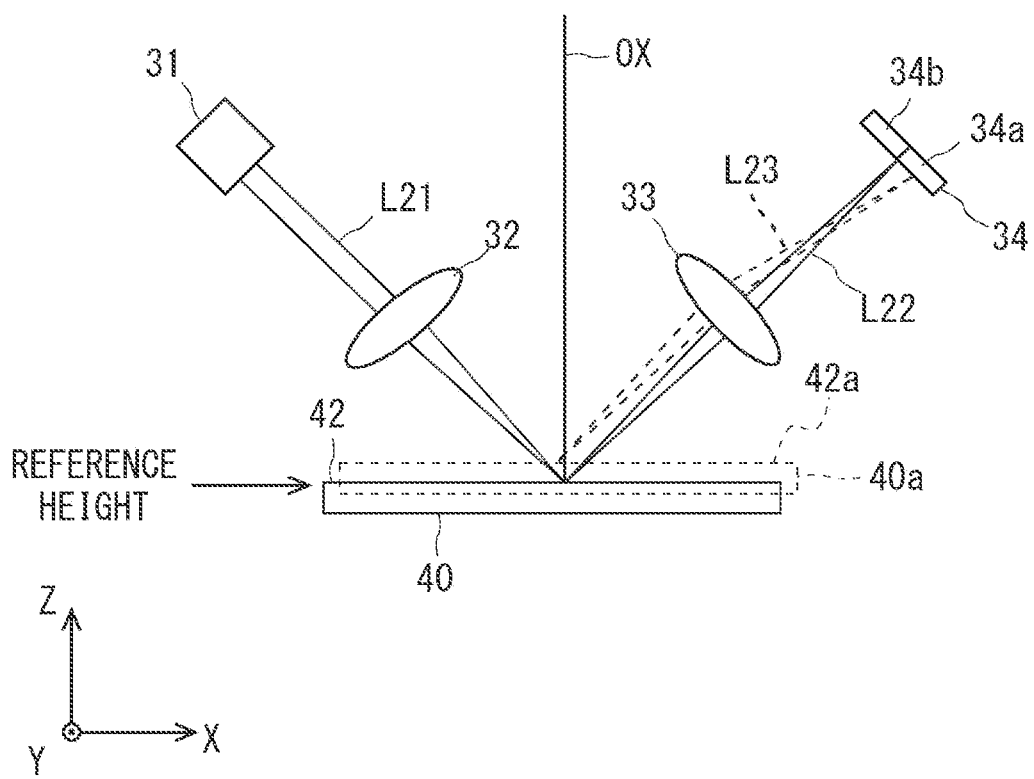
FIG. 3 is a top view schematically showing positions of support pins and a position where height information is detected.

Next, the height information detection unit 30 will be described. FIG. 3 is a side view schematically showing a configuration of the height information detection unit 30. In this example, the height information detection unit 30 detects information about the height of the sample 40 by using the optical lever method. The use of the optical-lever method makes it possible to detect the height information even when any specific detection pattern is not formed.

The height information detection unit 30 detects the position of the pattern-formed surface of the sample 40 in the Z-direction as the height information. The sample 40 is deformed by a bending thereof due to its own weight, a membrane stress, and the like. That is, the pattern-formed surface of the sample 40 is not completely flat. Therefore, the height indicated by the height information changes according to the XY-coordinates. The height (the Z-position) of the pattern-formed surface changes according to the XY-coordinates. The height information detection part 30 detects height information while associating the detected height information with XY-coordinates. The height information detection unit 30 outputs the height information to the processing device 50.

The image pickup apparatus 100 performs autofocusing (AF) based on the height information detected by the height information detection unit 30. Specifically, the drive control unit 56 adjusts the Z-position of the stage 10 based on the height information. Then, the image pickup optical system 20 takes an image of the sample 40 (i.e., photographs the sample 40) in a state where the focus is adjusted onto the pattern-formed surface of the sample 40.

The height information detection unit 30 includes an AF light source 31, a lens 32, a lens 33, and a photodetector 34. In FIG. 3, a situation in which the pattern-formed surface of the sample is positioned at a reference height is indicated by solid lines as a pattern-formed surface 42 of a sample 40. Meanwhile, a situation in which the pattern-formed surface of the sample is deviated from the reference height is indicated by broken lines as a pattern-formed surface 42a of a sample 40a. The reference height is, for example, a height of the pattern-formed surface 42 of the sample 40 in a state where the pattern-formed surface 42 is positioned at the in-focus position in the image pickup optical system 20. Further, in FIG. 3, the illustration of the pattern 41 is omitted for simplifying the drawing.

The AF light source 31 generates an AF light beam L21. The AF light source 31 is, for example, an LED light source or a point light source such as a laser diode. The light beam L21 emitted from the AF light source 31 enters the lens 32. The lens 32 concentrates the light beam L21 onto the sample 40. Note that the optical axis of the AF light source 31 is inclined from the Z-axis. That is, the light beam L21 is incident on the sample 40 from an obliquely upward point.

The light beam L22 reflected by the sample 40 enters the lens 33. Note that the lenses 33 and 32 are symmetrically arranged in the left/right direction with respect to the optical axis OX of the image pickup optical system 20. The lens 33 concentrates the light beam L22 onto the light receiving surface of the photodetector 34. The light beam L21 is incident on the sample 40 in an oblique direction. The optical axes of the light beams L21 and L22 are inclined from the Z-axis. When the height of the sample 40 changes, the place on the photodetector 34 at which the light is received (hereinafter also referred to as the light receiving place) changes. For example, when the pattern-formed surface 42 of the sample 40 is positioned at the reference height, the light beam L22 is incident at the center of the photodetector 34. When the pattern-formed surface 40a of the sample 42a is deviated from the reference height, the light receiving place deviates from the center of the photodetector 34.

The photodetector 34 is, for example, a dual-segment photodiode, and includes two photodiodes 34a and 34b. It is possible to obtain the amount of the deviation of the sample 40 from the reference height by comparing the amounts of light received by the photodiodes 34a and 34b of the photodetector 34. For example, when the pattern-formed surface 42 is at the reference height, a half of the light beam L22 is received by the photodiode 34a and the remaining half thereof is received by the photodiode 34b. The amounts of light received by the photodiodes 34a and 34b become equal to each other. When the pattern-formed surface 42a is higher than the reference height, the amount of light received by the photodiode 34a becomes smaller than that of the photodiode 34b. On the other hand, when the pattern-formed surface is lower than the reference height, the amount of light received by the photodiode 34a becomes larger than that of the photodiode 34b. Further, the more the pattern-formed surface 42a deviates from the reference height, the larger the difference between the amounts of light received by the two photodiodes 34a and 34b becomes.

It is possible to detect the height of the sample 40 by comparing the amounts of light received by the photodiodes 34a and 34b. Further, it is possible to perform autofocusing by performing feedback control so that the amounts of light received by the photodiodes 34a and 34b become equal to each other. The drive control unit 56 drives the stage 10 based on the result of the detection by the photodetector 34. Specifically, the drive control unit 56 changes the distance between the objective lens 23 and the sample 40 so that the difference between the output values of the photodiodes 34a and 34b follows zero (i.e., remains at zero). In this way, it is possible to adjust the height of the pattern-formed surface 42 so that it follows the in-focus position (i.e., moves to and remains at the in-focus position). Therefore, the image pickup optical system 20 can takes an image of the sample 40 in the in-focus state.

The height information detection unit 30 may detect the amount of the deviation of the pattern-formed surface 42a from the reference height as the height information. Alternatively, the height information detection unit 30 may detect the absolute Z-position of the pattern-formed surface 42a as the height information. That is, the height indicated by the height information may be an absolute position or a relative position. A part or all of the processing for calculating the height information may be performed by the processing device 50.

Note that although a two-segment photodiode is used as the photodetector 34 in the above descriptions, a four-segment photodiode, a position sensitive device (PSD: Position Sensitive Device), a CCD sensor, or the like may instead be used. Even when any of these sensors is used, the height information can be detected based on the place at which the light beam L22 is received.

Note that although the height information detection unit 30 includes the lenses 32 and 33 in FIG. 3, the objective lens 23 of the image pickup optical system 20 may be used instead of using the lenses 32 and 33. Specifically, the light beam L21 may be made to enter a half of the objective lens 23. In this case, the light beam L22 reflected by the sample 40 is made to pass through the other half on the opposite side of the objective lens 23. Even in this way, the height information detection unit 30 can detect the height information in a similar manner. Alternatively, the height information detection unit 30 may use an optical element(s) other than the lenses 32 and 33.

The height information detection unit 30 may detect the height information by using a method other than the optical-lever method. For example, height information detection unit 30 may acquire the height information by using a contrast of an image of the pattern taken by the image pickup element 24. Specifically, when the pattern-formed surface 42 is positioned at the in-focus position, an image in which the pattern is not blurred is taken, so that the contrast thereof increases. On the other hand, when the pattern-formed surface 42 is deviated from the in-focus position, an image in which the pattern is blurred is taken by the image pickup element 24, so that the contrast thereof decreases. Therefore, it is possible to detect the height information based on the contrast of the taken image of the pattern.

Referring to FIG. 1 again, the processing device 50 will be described. The processing device 50 performs processing for estimating the shape of the pattern-formed surface of the sample 40. The processing device 50 includes a bending data acquisition unit 51, a height data acquisition unit 52, a difference value calculation unit 53, a correction data calculation unit 54, an estimation unit 55, and a drive control unit 56.

The bending data acquisition unit 51 acquires bending data of the sample 40. The bending data is data indicating the amount of the bending of the sample 40 in a state where the sample 40 is supported on the stage 10. Specifically, since the positions, the number, the sizes, and the like of the support pins 12 in the stage 10 are known, the bending data can be calculated by a simulation. The bending data is data in which bending amounts are associated with XY-coordinates. The bending amount is expressed by a Z-position relative to the support pin 12.

Figure 4:
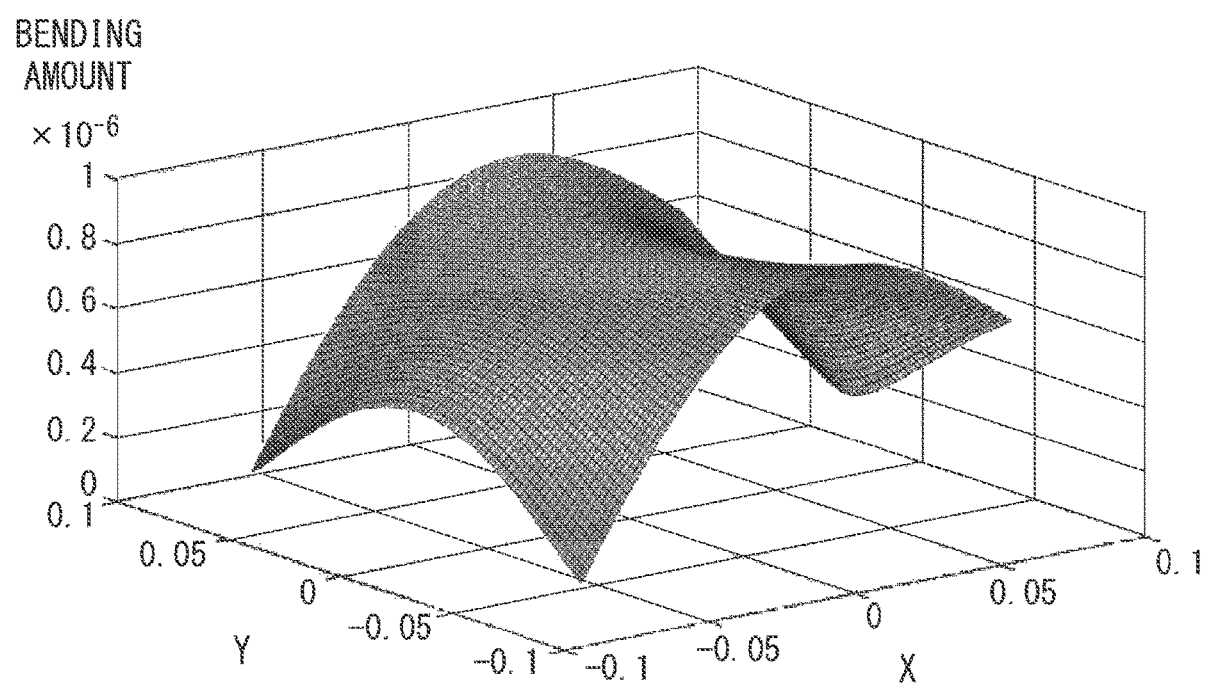
FIG. 4 is a three-dimensional graph showing bending data.
Figure 5:
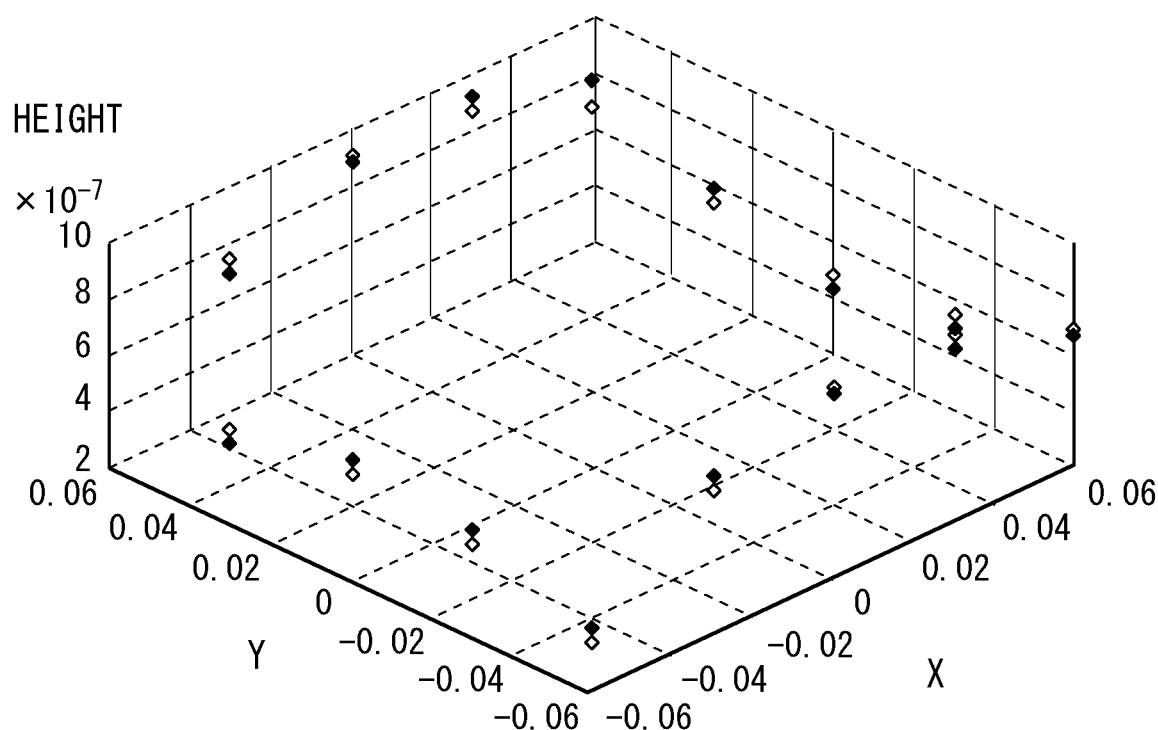
FIG. 5 is a three-dimensional graph showing height data.

FIG. 4 is a 3D graph showing bending data. FIG. 4 shows a curved surface representing heights indicated by bending data while using XY-coordinates as coordinates on the stage. The curved surface representing the bending data is defined as a reference curved surface. The reference curved surface indicates amounts of deformations (hereinafter also referred to as deformation amounts) of the sample 40 caused by the deformation due to its own weight. In this example, the bending data of the sample 40 supported by the support pins 12 shown in FIG. 3 is obtained by using a numerical analysis method. Specifically, the bending data acquisition unit 51 obtains a deformation amount at each XY-coordinates by using a finite element method.

The deformation amount becomes zero at places at which the sample 40 is supported by the support pins 12. The bending data acquisition unit 51 calculates deformation amounts at constant intervals in the X-direction and in the Y-directions. A bending amount at each XY-coordinates contained in the bending data is a calculated value indicating the height of the pattern-formed surface of the sample 40 at that XY-coordinates. Note that the bending data acquisition unit 51 calculates the bending amounts of the sample 40 in a state where any pattern such as a light blocking film is not formed, and defines (i.e., uses) the calculated bending amounts as bending data. For example, the bending data acquisition unit 51 calculates bending data by using the thickness, the material, and the size of the substrate of the photomask, which is the sample 40, and the positions, the number, and the sizes of the support pins 12. Needless to say, the bending data acquisition unit 51 may calculate, as the bending data, bending amounts of the sample 40 in a state where a pattern 41 is already formed thereon.

Although the bending data acquisition unit 51 calculates the bending data by performing a numerical analysis in the above-shown example, an apparatus other than the processing device 50 may calculate the bending data. In this case, the processing device 50 stores the bending data in a memory or the like in advance. Then, the bending data acquisition unit 51 reads the bending data from the memory or the like. Alternatively, the bending data may be stored in other apparatuses such as a server. In this case, the bending data acquisition unit 51 downloads the bending data through a network. Note that the bending amounts in the bending data are not limited to calculated values obtained by a simulation. That is, the bending amounts may be measured values that are obtained by measuring those of a standard sample (or an average sample).

The height data acquisition unit 52 acquires height data of the sample 40. Specifically, the height data acquisition unit 52 acquires height information detected by the height information detection unit 30 as the height data. The height information detection unit 30 detects height information of the pattern-formed surface of the sample 40 at a plurality of places on the sample 40. The height information contained in the height data is values actually measured by the height information detection unit 30.

In FIG. 2, places at which the height information detection unit 30 detects height information are indicated as measurement points M. The height information detection section 30 detects height information at eight measurement points M on the sample 40. Specifically, the four corners and the midpoint of each of the four sides of a rectangle indicated by broken lines are the measurement points M. Needless to say, the number of measurement points M is not limited to eight.

The height data acquisition unit 52 acquires height information at the eight measurement points M as the height data. In the height data, height information is associated with XY-coordinates. The height data indicates heights of the pattern-formed surface 42 at the measurement points M. In this example, the height data is data indicating heights at the eight measurement points M. The number of data contained in the height data is eight, which is sufficiently smaller than the number of data contained in the bending data.

The difference value calculation unit 53 calculates difference values between heights indicated by the height data and heights indicated by the bending data. The difference values are data indicating differences between actually measured values of deformation amounts of the sample 40 and calculated values thereof. The difference value calculation unit 53 calculates a difference value for each of the measurement points M. In FIG. 2, since the number of the measurement points M is eight, the difference value calculation unit 53 obtains eight difference values. The difference value calculation unit 53 calculates the same number of difference values as the number of measurement points M. Further, difference values at the places at which the sample 40 is supported by the support pins 12 may be added in the above-described difference values. Each of the difference values at the places at which the sample 40 is supported by the support pins 12 becomes zero. The difference values at the places at which the sample 40 is supported by the support pins 12 can be obtained without carrying out any measurement. In this way, a larger number of difference values can be acquired, so that the accuracy can be improved.

Note that if the bending amounts at the XY-coordinates of the measurement points M are not included in the bending data, the difference value calculation unit 53 may interpolate bending amounts at the measurement points M based on those near the measurement points M. That is, the difference value calculation unit 53 may obtain the bending amounts at the XY-coordinates of the measurement points M by interpolating them based on those that are already contained in the bending data.

Figure 6:
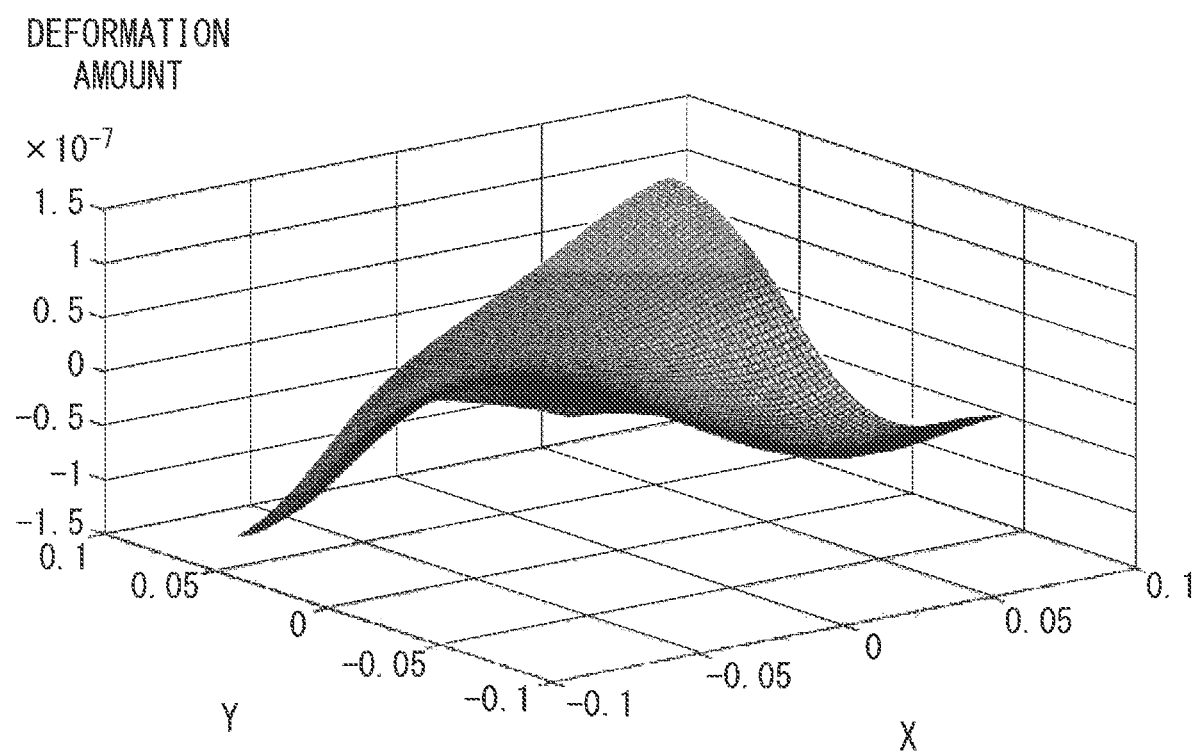
FIG. 6 is a three-dimensional graph showing correction data.

The correction data calculation unit 54 calculates correction data based on the difference values. The correction data is data indicating an amount of correction (hereinafter also referred to as a correction amount) at each XY coordinates. FIG. 6 is a 3D graph showing correction data. A curved surface representing the correction data is defined as a correction curved surface. The correction curved surface is a curved surface for correcting the reference curved surface to the actual surface shape of the pattern-formed surface.

The correction data indicates deformation amounts that are caused by components other than the bending of the sample 40 due to its own weight. For example, the sample 40 deforms due to a membrane stress and the like. Among the components other than the bending due to the own weight, only the short-period components become dominant components. Therefore, the correction data calculation unit 54 can extract only the short-period components based on the difference values at the measurement points M.

The correction data calculation unit 54 can obtain correction data by using a biharmonic equation. The principle of the calculation of the correction curved surface will be described hereinafter. When an interpolation curved surface satisfies the biharmonic equation, the minimum curvature is satisfied. The biharmonic equation is expressed by the below-shown Expression (1).

[Expression 1]

$$\Delta^2 f = 0 \qquad (1)$$

A smooth curved surface that contains the measurement points M can be formed by linearly combining the Green function of the biharmonic operator $\Delta^2$. The Green function $\varphi$ of the biharmonic operator is expressed by the below-shown Expression (2).

[Expression 2]

$$\Delta^2 \varphi(x,y) = \delta(x) \qquad (2)$$

In the expression, $\delta(x)$ is a delta function. Note that in the case of a 2D space (an XY-space), the Laplace operator $\Delta$ is expressed by the below-shown Expression (3).

[Expression 3]

$$\Delta = \frac{\partial^2}{\partial x^2} + \frac{\partial^2}{\partial y^2} \qquad (3)$$

The correction curved surface is formed by linearly combining the Green function that satisfies the above-shown expression. Since the biharmonic equation is satisfied at points other than the measurement points M, i.e., in the interpolation range, the correction curved surface S (x, y) is obtained by the below-shown Expression (4). Further, since actually measured values are obtained at the measurement points M, the correction curved surface is obtained by the below-shown Expression (5).

[Expression 4]

$$S(x,y) \Sigma \alpha_j \varphi(x - x_j, y - y_j) \qquad (4)$$

[Expression 5]

$$S(x_j, y_j) = dz_j \qquad (5)$$

Note that coordinates at a jth measurement point (j is an integer no smaller than one) are expressed as $(x_j, y_j)$ and a difference value thereof is represented by $dz_j$. The correction data calculation unit 54 can obtain the correction curved surface S (x, y) by calculating $\alpha_j$ by using the Expressions (4) and (5). The correction curved surface S (x, y) becomes a smooth curved surface containing the heights indicated by the measurement points M.

The Expression (6) shows a 1D (one-dimensional) displacement u, and the Expression (7) shows a 2D displacement u. That is, when a force fi is applied to the thin plate at coordinates $(x_j, y_j)$, the displacement u is expressed by the below-shown Expression (7). Note that since this expression is also similar to the above-shown expression, it is possible to properly correct the deviation from the result of the analysis resulting from the displacement.

[Expression 6]

$$\frac{d^4 u}{dx^4} = \begin{cases} f_j & x = x_j \\ 0 & \text{otherwise} \end{cases} \qquad (6)$$

[Expression 7]

$$\Delta^2 u = \begin{cases} f_j & x = x_j, y = y_j \\ 0 & \text{otherwise} \end{cases} \qquad (7)$$

As described above, the correction data calculation unit 54 calculates correction data from difference values by using the Green function of the biharmonic operator. The correction data calculation unit 54 obtains an approximate correction curved surface based on the function satisfying the biharmonic equation. The approximate correction curved surface can be efficiently obtained by using the biharmonic equation. Specifically, the use of the Green function of the biharmonic operator makes it possible to obtain a proper correction curved surface without performing complicated calculation.

Figure 7:
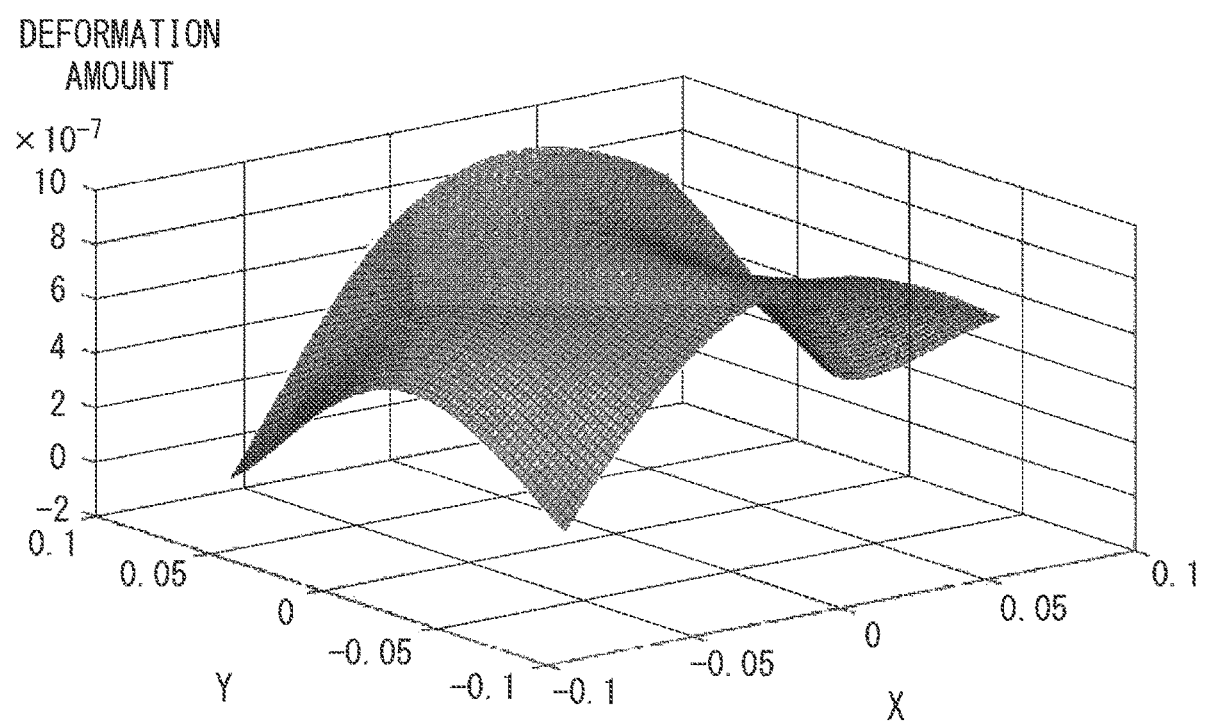
FIG. 7 is a three-dimensional graph showing estimation data.

The estimation unit 55 calculates estimation data for estimating heights of the sample by correcting the bending data using the correction data. Specifically, the estimation unit 55 calculates the estimation data by adding the correction data to the bending data. A curved surface representing the estimation data is defined as a predicted curved surface. The estimation data includes estimated values for estimating heights of the pattern-formed surface of the sample 40. That is, in the estimation data, XY-coordinates are associated with estimated values of heights. The heights indicated by the estimation data are also referred to as estimated heights. FIG. 7 is a 3D graph showing estimation data obtained from the bending data shown in FIG. 4 and the correction data shown in FIG. 6.

The drive control unit 56 controls the driving of the stage 10 based on the estimation data. The drive control unit 56 adjusts the focus while using heights in the estimation data (estimated heights) as the reference heights. The drive control unit 56 drives the stage 10 so that the focus position moves along the predicted curved surface. In this way, the focus position moves so as to follow (i.e., move along) the predicted curved surface. Further, in addition to the operation for following the predicted curved surface, the drive control unit 56 can perform autofocusing. Specifically, the drive control unit 56 drives the stage 10 in the Z-direction so as to perform autofocusing while using the estimated height as the start point of the autofocusing. The drive control unit 56 changes the distance between the objective lens 23 and the sample 40 in order to adjust the focus. By doing so, it is possible to adjust the focus while preventing the focus position from widely deviating from the pattern-formed surface of the sample 40. Therefore, it is possible to properly and speedily adjust the focus. When autofocusing is performed, the Z-position of the stage 10 may be measured by using measurement means other than the height information detection unit 30. In this way, the image pickup element 24 can take an image of the sample 40 in the in-focus state without using the height information detection unit 30.

In this embodiment, the difference value calculation unit 53 calculates difference values between heights indicated by the bending data and heights indicated by the height data. The heights indicated by the bending data are values calculated by a simulation, and the heights indicated by the height data are actually measured values. The correction data calculation unit 54 obtains correction data based on the difference values. The correction data is a correction curved surface representing differences between the deformation amounts in the calculated bending data and those in the height data obtained by actual measurement. The estimation unit 55 obtains estimation data by correcting the bending data using correction data. The estimation unit 55 corrects the reference curved surface by using the correction curved surface. The processing device 50 can acquire a proper predicted curved surface through a small amount of calculation. The drive control unit 56 performs autofocusing while using the heights in the estimation data as the reference heights.

According to the method in accordance with this embodiment, even when the number of measurement points M is small, the heights of the pattern-formed surface can be accurately estimated. That is, since the predicted curved surface is not directly obtained from the heights of the measurement points M, the errors in the deformation amounts can be reduced. It is possible to estimate the heights of the pattern-formed surface with higher accuracy. It is possible to perform autofocusing based on the estimated heights and hence to prevent the focus position from widely deviating. Therefore, it is possible to properly and speedily adjust the focus. Further, since the correction data calculation unit 54 uses the biharmonic equation, it is possible to obtain the correction curved surface by using a smaller number of measurement points. The estimation unit 55 can accurately obtain the predicted curved surface.

Note that although the correction data is used by using the biharmonic equation in the above descriptions, the correction curved surface may be obtained by an approximation of a curved surface other than that using the biharmonic equation. For example, the correction data may be calculated by an approximation of a curved surface using, for example, a polynomial expression of the second order or higher. The approximate function is preferably a polynomial expression in which each of X and Y is in the fourth order or higher. When the approximation is obtained by using a polynomial expression, the number of necessary measurement points may be determined according to the order of the polynomial expression.

It is also possible to detect the structure of the sample 40 by using the detection of heights by the height information detection unit 30 when the sample 40 is inspected. For example, when the sample 40 is a photomask, it is possible to detect a light blocking film, a multilayer film, a low reflection layer, and the like provided on the pattern-formed surface.

Note that if the error between the height of the predicted curved surface and that of the pattern-formed surface is large at the time of the AF, the drive control unit 56 may control the error so as to reduce the error component. Specifically, there are cases where the error between the estimated height indicated by the predicted curved surface and the height detected by the height information detection unit 30 is equal to or larger than a threshold. When the amount of the deviation of the focus in the predicted curved surface is large as described above, the drive control unit 56 may perform autofocusing while using a height that is deviated from the predicted curved surface by a predetermined value as the reference height.

The processing device 50 is not limited to a single physical apparatus. That is, the processing in the processing device 50 may be performed in a distributed manner over a plurality of apparatuses. For example, a processing device that acquires detection data from the image pickup element 24 and acquires height information from the photodetector 34 may be physically different from a processing device that performs arithmetic processing thereof.

Some or all of the above-described processes performed by the processing device 50 may be performed by a computer program. The above-described program can be stored in various types of non-transitory computer readable media and thereby supplied to the computer. The non-transitory computer readable media includes various types of tangible storage media. Examples of the non-transitory computer readable media include a magnetic recording medium (such as a flexible disk, a magnetic tape, and a hard disk drive), a magneto-optic recording medium (such as a magneto-optic disk), a CD-ROM (Read Only Memory), a CD-R, and a CD-R/W, and a semiconductor memory (such as a mask ROM, a PROM (Programmable ROM), an EPROM (Erasable PROM), a flash ROM, and a RAM (Random Access Memory)). Further, the program can be supplied to the computer by using various types of transitory computer readable media. Examples of the transitory computer readable media include an electrical signal, an optical signal, and an electromagnetic wave. The transitory computer readable media can be used to supply programs to the computer through a wire communication path such as an electrical wire and an optical fiber, or wireless communication path.

Although the embodiments according to the present disclosure have been explained above, the present disclosure also includes various modifications that do not substantially impair the purposes and the advantages of the present disclosure. Further, the above-described embodiments should not be used to limit the scope of the present disclosure.

The first and second embodiments can be combined as desirable by one of ordinary skill in the art.

From the disclosure thus described, it will be obvious that the embodiments of the disclosure may be varied in many ways. Such variations are not to be regarded as a departure from the spirit and scope of the disclosure, and all such modifications as would be obvious to one skilled in the art are intended for inclusion within the scope of the following claims.

The invention claimed is:

1. An image pickup apparatus comprising:
   a stage configured to support a sample at a plurality of support points;
   a bending data acquisition unit configured to acquire bending data corresponding to a bending of the sample supported on the stage;
   a height information detection unit configured to detect height information of the sample supported on the stage;
   a difference value calculation unit configured to calculate a difference value between a height indicated by the height information and a height indicated by the bending data at each of a plurality of points on the sample;
   a correction data calculation unit configured to calculate correction data based on the difference value;
   an estimation unit configured to calculate estimation data for estimating the height of the sample by correcting the bending data using the correction data; and
   a control unit configured to adjust a focus by using the estimation data in order to take an image of the sample.

2. The image pickup apparatus according to claim 1, wherein the correction data calculation unit calculates the correction data by using a biharmonic equation.

3. The image pickup apparatus according to claim 1, further comprising:
   an illumination light source configured to generate illumination light;
   an optical element configured to concentrate light coming from the sample illuminated by the illumination light; and
   a detector configured to detect light coming from the optical element, wherein
   the control unit performs autofocusing by changing a distance between the optical element and the sample while using a height in the estimation data as a reference height.

4. The image pickup apparatus according to claim 1, wherein the bending data is obtained by a numerical analysis.

5. A focus adjustment method for adjusting a focus onto a sample supported on a stage having a plurality of support points, comprising:
   acquiring bending data corresponding to a bending of the sample supported on the stage;
   detecting height information of the sample supported on the stage;
   calculating a difference value between a height indicated by the height information and a height indicated by the bending data at each of a plurality of points on the sample;
   calculating correction data based on the difference value;
   calculating estimation data for estimating the height of the sample by correcting the bending data using the correction data; and
   adjusting a focus by using the estimation data.

6. The focus adjustment method according to claim 5, wherein the correction data is calculated by using a biharmonic equation.

7. The focus adjustment method according to claim 5, wherein
   a detector detects light coming from the sample illuminated by illumination light through an optical element, and
   autofocusing is performed by changing a distance between the optical element and the sample while using a height in the estimation data as a reference height.

8. The focus adjustment method according to claim 5, wherein the bending data is obtained by a numerical analysis.

* * * * *